(12) United States Patent
Sherrer et al.

(10) Patent No.: US 10,076,042 B2
(45) Date of Patent: Sep. 11, 2018

(54) DEVICES AND METHODS FOR SOLDER FLOW CONTROL IN THREE-DIMENSIONAL MICROSTRUCTURES

(71) Applicant: Nuvotronics, Inc., Radford, VA (US)

(72) Inventors: David W. Sherrer, Cary, NC (US); James R. Reid, Billerica, MA (US)

(73) Assignee: NUVOTRONICS, INC, Radford, VA (US)

( * ) Notice: Subject to any disclaimer, the term of this patent is extended or adjusted under 35 U.S.C. 154(b) by 0 days.

(21) Appl. No.: 15/341,378

(22) Filed: Nov. 2, 2016

(65) Prior Publication Data
US 2017/0055348 A1    Feb. 23, 2017

Related U.S. Application Data

(60) Continuation of application No. 14/494,716, filed on Sep. 24, 2014, now Pat. No. 9,505,613, which is a
(Continued)

(51) Int. Cl.
*H01L 23/48* (2006.01)
*H02G 15/00* (2006.01)
(Continued)

(52) U.S. Cl.
CPC ......... *H05K 3/341* (2013.01); *B81C 1/00357* (2013.01); *H01L 24/26* (2013.01); *H01L 24/83* (2013.01); *H05K 1/111* (2013.01); *H05K 1/181* (2013.01); *H05K 3/4007* (2013.01); *B81C 2201/019* (2013.01); *H01L 2224/26175* (2013.01); *H01L 2224/291* (2013.01); *H01L 2224/3015* (2013.01); *H01L 2224/32227* (2013.01); *H01L 2224/83191* (2013.01); *H01L 2224/83815* (2013.01);
(Continued)

(58) Field of Classification Search
CPC ........ H05K 1/111; H05K 1/181; H05K 3/341; H05K 3/4007; H05K 3/321; H01L 24/26; H01L 24/83; B81C 1/00357
See application file for complete search history.

(56) References Cited

U.S. PATENT DOCUMENTS 3,157,847 A    11/1964  Williams
3,526,867 A    9/1970   Keeler
(Continued)

FOREIGN PATENT DOCUMENTS

JP    2003032007        1/2003
WO    2005112105        11/2005
WO    2009013751 A2     1/2009

OTHER PUBLICATIONS

Tian, et al.; Fabrication of multilayered SU8 structure for terahertz waveguide with ultralow transmission loss; Aug. 18, 2013; Dec. 10, 2013; pp. 13002-1 to 13002-6.
(Continued)

*Primary Examiner* — Alonzo Chambliss
(74) *Attorney, Agent, or Firm* — Niels Haun; Dann, Dorfman, Herrell and Skillman, P.C.

(57) ABSTRACT

Structures, materials, and methods to control the spread of a solder material or other flowable conductive material in electronic and/or electromagnetic devices are provided.

31 Claims, 11 Drawing Sheets

Related U.S. Application Data division of application No. 13/488,991, filed on Jun. 5, 2012, now Pat. No. 8,866,300.

(60) Provisional application No. 61/493,516, filed on Jun. 5, 2011.

(51) Int. Cl.
| | |
|---|---|
| *H05K 3/34* | (2006.01) |
| *B81C 1/00* | (2006.01) |
| *H01L 23/00* | (2006.01) |
| *H05K 1/11* | (2006.01) |
| *H05K 3/40* | (2006.01) |
| *H05K 1/18* | (2006.01) |
| *H05K 3/32* | (2006.01) |

(52) U.S. Cl.
CPC .... *H01L 2924/12042* (2013.01); *H05K 3/321* (2013.01); *H05K 3/34* (2013.01); *H05K 2201/10674* (2013.01); *H05K 2201/10787* (2013.01); *H05K 2201/10984* (2013.01); *H05K 2203/0465* (2013.01); *H05K 2203/1173* (2013.01); *Y02P 70/611* (2015.11)

(56) References Cited

U.S. PATENT DOCUMENTS

| | | | |
|---|---|---|---|
| 4,539,534 | A | 9/1985 | Hudspeth |
| 4,647,878 | A | 3/1987 | Landis |
| 4,677,393 | A | 6/1987 | Sharma |
| 4,684,181 | A | 8/1987 | Massit |
| 4,859,806 | A | 8/1989 | Smith |
| 4,909,909 | A | 3/1990 | Florjancic |
| 4,915,983 | A | 4/1990 | Lake |
| 5,089,880 | A | 2/1992 | Meyer |
| 5,213,511 | A | 5/1993 | Sobhani |
| 5,299,939 | A | 4/1994 | Walker |
| 5,312,456 | A | 5/1994 | Reed |
| 5,529,504 | A | 6/1996 | Greenstein |
| 5,903,059 | A | 5/1999 | Bertin |
| 6,101,705 | A | 8/2000 | Wolfson |
| 6,183,268 | B1 | 2/2001 | Consoli |
| 6,889,433 | B1 | 5/2005 | Enomoto |
| 7,116,190 | B2 | 10/2006 | Brunker |
| 7,148,772 | B2 * | 12/2006 | Sherrer ............... H01P 1/08 333/243 |
| 7,383,632 | B2 | 6/2008 | Dittmann |
| 7,628,617 | B2 | 12/2009 | Brown |
| 7,645,147 | B2 | 1/2010 | Dittmann |
| 7,741,853 | B2 | 6/2010 | Blakely |
| 8,641,428 | B2 | 2/2014 | Light |
| 8,866,300 | B1 * | 10/2014 | Sherrer ............... B81C 1/00357 174/73.1 |
| 8,888,504 | B2 | 11/2014 | Pischler |
| 9,306,254 | B1 | 4/2016 | Hovey |
| 9,505,613 | B2 * | 11/2016 | Sherrer ............... B81C 1/00357 |
| 9,583,856 | B2 | 2/2017 | Sherrer |
| 9,633,976 | B1 | 4/2017 | Bernstein |
| 2001/0040051 | A1 | 11/2001 | Lipponen |
| 2001/0045361 | A1 | 11/2001 | Boone |
| 2002/0127768 | A1 | 9/2002 | Badir |
| 2004/0003524 | A1 | 1/2004 | Ha |
| 2005/0013977 | A1 | 1/2005 | Wong |
| 2009/0004385 | A1 | 1/2009 | Blackwell |
| 2016/0054385 | A1 | 2/2016 | Suto |

OTHER PUBLICATIONS

J. R. Mruk, H. Zhou, H. Levitt, D. Filipovic, "Dual wideband monolithically integrated millimeter-wave passive front-end subsystems," in 2010 Int. Conf. on Infrared, Millimeter and Terahertz Waves, Sep. 2010, pp. 1-2.

J. R. Mruk, N. Sutton, D. S. Filipovic, "Micro-coaxial fed 18 to 110 GHz planar log-periodic antennas with RF transitions," IEEE Trans. Antennas Propag., vol. 62, No. 2, Feb. 2014, pp. 968-972.

J. Reid, "PolyStrata Millimeter-wave Tunable Filters," GOMACTech-12, Mar. 22, 2012.

J.M. Oliver, H. Kazemi, J.-M. Rollin, D. Sherrer, S. Huettner, S. Raman, "Compact, low-loss, micromachined rectangular coaxial millimeter-wave power combining networks," 2013 IEEE MTT-S Int. Microwave, Symp., Seattle, Wa, Jun. 2013.

J.R. Mruk, Y. Saito, K. Kim, M. Radway, D. Filipovic, "A directly fed Ku- to W-band 2-arm Archimedean spiral antenna," Proc. 41st European Microwave Conf., Oct. 2011, pp. 539-542.

J.R. Reid, D. Hanna, R.T. Webster, "A 40/50 GHz diplexer realized with three dimensional copper micromachining," in 2008 IEEE MTT-S Int. Microwave Symp., Atlanta, GA, Jun. 2008, pp. 1271-1274.

J.R. Reid, J.M. Oliver, K. Vanhille, D. Sherrer, "Three dimensional metal micromachining: A disruptive technology for millimeter-wave filters," 2012 IEEE Topical Meeting on Silicon Monolithic Integrated Circuits in RF Systems, Jan. 2012.

K. J. Vanhille, D. L. Fontaine, C. Nichols, D. S. Filipovic, and Z. Popovic, "Quasi-planar high-Q millimeter-wave resonators," IEEE Trans. Microwave Theory Teck, vol. 54, No. 6, pp. 2439-2446, Jun. 2006.

K. M. Lambert, F. A. Miranda, R. R. Romanofsky, T. E. Durham, K. J. Vanhille, "Antenna characterization for the Wideband Instrument for Snow Measurements (WISM)," 2015 IEEE Antenna and Propagation Symposium, Vancouver, Canada, Jul. 2015.

K. Vanhille, "Design and Characterization of Microfabricated Three-Dimensional Millimeter-Wave Components," Thesis, 2007.

K. Vanhille, M. Buck, Z. Popovic, and D.S. Filipovic, "Miniature Ka-band recta-coax components: analysis and design," presented at 2005 AP-S/URSI Symposium, Washington, DC, Jul. 2005.

K. Vanhille, M. Lukic, S. Rondineau, D. Filipovic, and Z. Popovic, "Integrated micro-coaxial passive components for millimeter-wave antenna front ends," 2007 Antennas, Radar, and Wave Propagation Conference, May 2007.

K. Vanhille, T. Durham, W. Stacy, D. Karasiewicz, A. Caba, C. Trent, K. Lambert, F. Miranda, "A microfabricated 8-40 GHz dual-polarized reflector feed," 2014 Antenna Applications Symposium, Monticello, IL, Sep. 2014. pp. 241-257.

L. Ranzani, D. Kuester, K. J. Vanhille, A Boryssenko, E. Grossman, Z. Popovic, "G-Band micro-fabricated frequency-steered arrays with 2°/GHz beam steering," IEEE Trans. on Terahertz Science and Technology, vol. 3, No. 5, Sep. 2013.

L. Ranzani, E. D. Cullens, D. Kuester, K. J. Vanhille, E. Grossman, Z. Popovic, "W-band micro-fabricated coaxially-fed frequency scanned slot arrays," IEEE Trans. Antennas Propag., vol. 61, No. 4, Apr. 2013.

L. Ranzani, I. Ramos, Z. Popovic, D. Maksimovic, "Microfabricated transmission-line transformers with DC isolation," URSI National Radio Science Meeting, Boulder, CO, Jan. 2014.

L. Ranzani, N. Ehsan, Z. Popović, "G-band frequency-scanned antenna arrays," 2010 IEEE APS-URSI International Symposium, Toronto, Canada, Jul. 2010.

M. Lukic, D. Filipovic, "Modeling of surface roughness effects on the performance of rectangular µ-coaxial lines," Proc. 22nd Ann. Rev. Prog. Applied Comp. Electromag. (ACES), pp. 620-625, Miami, Mar. 2006.

M. Lukic, D. Fontaine, C. Nichols, D. Filipovic, "Surface micromachined Ka-band phased array antenna," Presented at Antenna Applic. Symposium, Monticello, IL, Sep. 2006.

M. Lukic, K. Kim, Y. Lee, Y. Saito, and D. S. Filipovic, "Multi-physics design and performance of a surface micromachined Ka-band cavity backed patch antenna," 2007 SBMO/IEEE Int. Microwave and Optoelectronics Conf., Oct. 2007, pp. 321-324.

M. Lukic, S. Rondineau, Z. Popovic, D. Filipovic, "Modeling of realistic rectangular µ-coaxial lines," IEEE Trans. Microwave Theory Tech., vol. 54, No. 5, pp. 2068-2076, May 2006.

M. V. Lukic, and D. S. Filipovic, "Integrated cavity-backed ka-band phased array antenna," Proc. IEEE-APS/URSI Symposium, Jun. 2007, pp. 133-135.

(56) References Cited

OTHER PUBLICATIONS

M. V. Lukic, D. S. Filipovic, "Modeling of 3-D Surface Roughness Effects With Application to µ-Coaxial Lines," IEEE Trans. Microwave Theory Tech., Mar. 2007, pp. 518-525.

M. V. Lukic, and D. S. Filipovic, "Surface-micromachined dual Ka-and cavity backed patch antenna," IEEE Trans. Antennas Propag., vol. 55, No. 7, pp. 2107-2110, Jul. 2007.

Mruk, J.R., Filipovic, D.S, "Micro-coaxial V-/W-band filters and contiguous diplexers," Microwaves, Antennas & Propagation, IET, Jul. 17, 2012, vol. 6, issue 10, pp. 1142-1148.

Mruk, J.R., Saito, Y., Kim, K., Radway, M., Filipovic, D.S., "Directly fed millimetre-wave two-arm spiral antenna," Electronics Letters, Nov. 25, 2010, vol. 46, issue 24, pp. 1585-1587.

N. Chamberlain, M. Sanchez Barbetty, G. Sadowy, E. Long, K. Vanhille, "A dual-polarized metal patch antenna element for phased array applications," 2014 IEEE Antenna and Propagation Symposium, Memphis, Jul. 2014. pp. 1640-1641.

N. Ehsan, "Broadband Microwave Lithographic 3D Components," Thesis, 2009.

N. Ehsan, K. Vanhille, S. Rondineau, E Cullens, Z. Popovic, "Broadband Wilkinson Dividers," IEEE Trans. Microwave Theory Tech., Nov. 2009, pp. 2783-2789.

N. Ehsan, K.J. Vanhille, S. Rondineau, Z. Popovic, "Micro-coaxial impedance transformers," IEEE Trans. Microwave Theory Tech., Nov. 2010, pp. 2908-2914.

N. Jastram, "Design of a Wideband Millimeter Wave Micromachined Rotman Lens," IEEE Transactions on Antennas and Propagation, vol. 63, No. 6, Jun. 2015.

N. Jastram, "Wideband Millimeter-Wave Surface Micromachined Tapered Slot Antenna," IEEE Antennas and Wireless Propagation Letters, vol. 13, 2014.

N. Jastram, "Wideband Multibeam Millimeter Wave Arrays," IEEE 2014.

N. Jastram, D. Filipovic, "Monolithically integrated K/Ka array-based direction finding subsystem," Proc. IEEE-APS/URSI Symposium, Chicago, IL, Jul. 2012, pp. 1-2.

N. Jastram, D. S. Filipovic, "Parameter study and design of W-band micromachined tapered slot antenna," Proc. IEEE-APS/URSI Symposium, Orlando, FL, Jul. 2013, pp. 434-435.

N. Jastram, D. S. Filipovic, "PCB-based prototyping of 3-D micromachined RF subsystems," IEEE Trans. Antennas Propag., vol. 62, No. 1, Jan. 2014. pp. 420-429.

N. Sutton, D.S. Filipovic, "Design of a K- thru Ka-band modified Butler matrix feed for a 4-arm spiral antenna," 2010 Loughborough Antennas and Propagation Conference, Loughborough, UK, Nov. 2010, pp. 521-524.

N.A. Sutton, D. S. Filipovic, "V-band monolithically integrated four-arm spiral antenna and beamforming network," Proc. IEEE-APS/URSI Symposium, Chicago, IL, Jul. 2012, pp. 1-2.

N.A. Sutton, J. M. Oliver, D. S. Filipovic, "Wideband 15-50 GHz symmetric multi-section coupled line quadrature hybrid based on surface micromachining technology," 2012 IEEE MTT-S Int. Microwave, Symp., Montreal, Canada, Jun. 2012.

N.A. Sutton, J.M. Oliver, D.S. Filipovic, "Wideband 18-40 GHz surface micromachined branchline quadrature hybrid," IEEE Microwave and Wireless Components Letters, Sep. 2012, vol. 22, No. 9, pp. 462-464.

P. Ralston, K. Vanhille, A. Caba, M. Oliver, S. Raman, "Test and verification of micro coaxial line power performance," 2012 IEEE MTT-S Int. Microwave, Symp., Montreal, Canada, Jun. 2012.

P. Ralston, M. Oliver, K. Vummidi, S. Raman, "Liquid-metal vertical interconnects for flip chip assembly of GaAs C-band power amplifiers onto micro-rectangular coaxial transmission lines," IEEE Compound Semiconductor Integrated Circuit Symposium, Oct. 2011.

P. Ralston, M. Oliver, K. Vummidi, S. Raman, "Liquid-metal vertical interconnects for flip chip assembly of GaAs C-band power amplifiers onto micro-rectangular coaxial transmission lines," IEEE Journal of Solid-State Circuits, Oct. 2012, vol. 47, No. 10, pp. 2327-2334.

S. Huettner, "High Performance 3D Micro-Coax Technology," Microwave Journal, Nov. 2013. [online: http://www.microwavejournal.com/articles/21004-high-performance-3d-micro-coax-technology].

S. Huettner, "Transmission lines withstand vibration," Microwaves and RF, Mar. 2011. [online: http://mwrf.com/passive-components/transmission-lines-withstand-vibration].

S. Scholl, C. Gorle, F. Houshmand, T. Liu, H. Lee, Y. Won, H. Kazemi, M. Asheghi, K. Goodson, "Numerical Simulation of Advanced Monolithic Microcooler Designs for High Heat Flux Microelectronics," InterPACK, San Francisco, CA, Jul. 2015.

S. Scholl, C. Gorle, F. Houshmand, T. Verstraete, M. Asheghi, K. Goodson, "Optimization of a microchannel geometry for cooling high heat flux microelectronics using numerical methods," InterPACK, San Francisco, CA, Jul. 2015.

T. Durham, H.P. Marshall, L. Tsang, P. Racette, Q. Bonds, F. Miranda, K. Vanhille, "Wideband sensor technologies for measuring surface snow," Earthzine, Dec. 2013, [online: http://www.earthzine.org/2013/12/02/wideband-sensor-technologies-for-measuring-surface-snow/].

T. E. Durham, C. Trent, K. Vanhille, K. M. Lambert, F. A. Miranda, "Design of an 8-40 GHz Antenna for the Wideband Instrument for Snow Measurements (WISM)," 2015 IEEE Antenna and Propagation Symposium, Vancouver, Canada, Jul. 2015.

T. Liu, F. Houshmand, C. Gorle, S. Scholl, H. Lee, Y. Won, H. Kazemi, K. Vanhille, M. Asheghi, K. Goodson, "Full-Scale Simulation of an Integrated Monolithic Heat Sink for Thermal Management of a High Power Density GaN—SiC Chip," InterPACK/ICNMM, San Francisco, CA, Jul. 2015.

International Preliminary Report on Patentability dated May 19, 2006 on corresponding PCT/US04/06665.

International Search Report dated Aug. 29, 2005 on corresponding PCT/US04/06665.

Jeong, I., et al., "High Performance Air-Gap Transmission Lines and Inductors for Milimeter-Wave Applications", Transactions on Microwave Theory and Techniques, vol. 50, No. 12, Dec. 2002.

Lukic, M. et al., "Surface-micromachined dual Ka-band cavity backed patch antennas," IEEE Trans. AtennasPropag., vol. 55, pp. 2107-2110, Jul. 2007.

Oliver, J.M. et al., "A 3-D micromachined W-band cavity backed patch antenna array with integrated rectacoax transition to wave guide," 2009 Proc. IEEE International Microwave Symposium, Boston, MA 2009.

PwrSoC Update 2012: Technology, Challenges, and Opportunities for Power Supply on Chip, Presentation (Mar. 18, 2013).

Rollin, J.M. et al., "A membrane planar diode for 200GHz mixing applications," 29th International Conference on Infrared and Millimeter Waves and Terahertz Electronics, pp. 205-206, Karlsruhe, 2004.

Rollin J.M. et al., "Integrated Schottky diode for a sub-harmonic mixer at millimetre wavelengths," 31st International Conference on Infrared and Millimeter Waves and Terahertz Electronics, Paris, 2006.

Saito, Y., Fontaine, D., Rollin, J-M., Filipovic, D., 'Micro-Coaxial Ka-Band Gysel Power Dividers,' Microwave Opt Technol Lett 52: 474-478, 2010, Feb. 2010.

Saito et al., "Analysis and design of monolithic rectangular coaxial lines for minimum coupling," IEEE Trans. Microwave Theory Tech., vol. 55, pp. 2521-2530, Dec. 2007.

Sherrer, D, Vanhille, K, Rollin, J.M., 'PolyStrata Technology: A Disruptive Approach for 3D Microwave Components and Modules,' Presentation (Apr. 23, 2010).

Vanhille, K., 'Design and Characterization of Microfabricated Three-Dimensional Millimeter-Wave Components,' Dissertation, 2007.

Vanhille, K. et al., 'Balanced low-loss Ka-band-coaxial hybrids,' IEEE MTT-S Dig., Honolulu, Hawaii, Jun. 2007.

Vanhille, K. et al., "Ka-Band surface mount directional coupler fabricated using micro-rectangular coaxial transmission lines," 2008 Proc. IEEE International Microwave Symposium, 2008.

Vanhille, K.J. et al., "Ka-band miniaturized quasi-planar high-Q resonators," IEEE Trans. Microwave Theory Tech., vol. 55, No. 6, pp. 1272-1279, Jun. 2007.

(56) References Cited

OTHER PUBLICATIONS

Vyas R. et al., "Liquid Crystal Polymer (LCP): The ultimate solution for low-cost Rf flexible electronics and antennas," Antennas and Propagation Society, International Symposium, p. 1729-1732 (2007).

Wang, H. et al., "Design of a low integrated sub-harmonic mixer at 183GHz using European Schottky diode technology," From Proceedings of the 4th ESA workshop on Millimetre-Wave Technology and Applications, pp. 249-252, Espoo, Finland, Feb. 2006.

Wang, H. et al., "Power-amplifier modules covering 70-113 GHz using MMICs," IEEE Trans Microwave Theory and Teck, vol. 39, pp. 9-16, Jan. 2001.

Written Opinion of the International Searching Authority dated Aug. 29, 2005 on corresponding PCT/US04/06665.

"Multiplexer/LNA Module using PolyStrata®," GOMACTech-15, Mar. 26, 2015.

"Shiffman phase shifters designed to work over a 15-45GHz range," phys.org, Mar. 2014. [online: http://phys.org/wire-news/156496085/schiffman-phase-shifters-designed-to-work-over-a-15-45ghz-range.html].

A. Boryssenko, J. Arroyo, R. Reid, M.S. Heimbeck, "Substrate free G-band Vivaldi antenna array design, fabrication and testing" 2014 IEEE International Conference on Infrared, Millimeter, and Terahertz Waves, Tucson, Sep. 2014.

A. Boryssenko, K. Vanhille, "300-GHz microfabricated waveguide slotted arrays" 2014 IEEE International Conference on Infrared, Millimeter, and Terahertz Waves, Tucson, Sep. 2014.

A.A. Immorlica Jr., R. Actis, D. Nair, K. Vanhille, C. Nichols, J.-M. Rollin, D. Fleming, R. Varghese, D. Sherrer, D Filipovic, E. Cullens, N. Ehsan, and Z. Popovic, "Miniature 3D micromachined solid state amplifiers," in 2008 IEEE International Conference on Microwaves, Communications, Antennas, and Electronic Systems, Tel-Aviv, Israel, May 2008, pp. 1-7.

B. Cannon, K Vanhille, "Microfabricated Dual-Polarized, W-band Antenna Architecture for Scalable Line Array Feed," 2015 IEEE Antenna and Propagation Symposium, Vancouver, Canada, Jul. 2015.

D. Filipovic, G. Potvin, D. Fontaine, C. Nichols, Z. Popovic, S. Rondineau, M. Lukic, K. Vanhille, Y. Saito, D. Sherrer, W. Wilkins, E. Daniels, E. Adler, and J. Evans, "Integrated micro-coaxial Ka-band antenna and array," GomacTech 2007 Conference, Mar. 2007.

D. Filipovic, G. Potvin, D. Fontaine, Y. Saito, J.-M. Rollin, Z. Popovic, M. Lukic, K. Vanhille, C. Nichols, "μ-coaxial phased arrays for Ka-Band Communications," Antenna Applications Symposium, Monticello, IL, Sep. 2008, pp. 104-115.

D. Filipovic, Z. Popovic, K. Vanhille, M. Lukic, S. Rondineau, M. Buck, G. Potvin, D. Fontaine, C. Nichols, D. Sherrer, S. Zhou, W Houck, D. Fleming, E. Daniel, W. Wilkins, V. Sokolov, E. Adler, and J. Evans, "Quasi-planar rectangular μ-coaxial structures for mm-wave applications," Proc. GomacTech., pp. 28-31, San Diego, Mar. 2006.

D. Sherrer, "Improving electronics' functional density," MICROmanufacturing, May/Jun. 2015, pp. 16-18.

D.S. Filipovic, M. Lukic, Y. Lee and D. Fontaine, "Monolithic rectangular coaxial lines and resonators with embedded dielectric support," IEEE Microwave and Wireless Components Letters, vol. 18, No. 11, pp. 740-742, 2008.

E. Cullens, "Microfabricated Broadband Components for Microwave Front Ends," Thesis, 2011.

E. Cullens, K. Vanhille, Z. Popovic, "Miniature bias-tee networks integrated in microcoaxial lines," in Proc. 40th European Microwave Conf., Paris, France, Sep. 2010, pp. 413-416.

E. Cullens, L. Ranzani, E. Grossman, Z. Popovic, "G-Band Frequency Steering Antenna Array Design and Measurements," Proceedings of the XXXth URSI General Assembly, Istanbul, Turkey, Aug. 2011.

E. Cullens, L. Ranzani, K. Vanhille, E. Grossman, N. Ehsan, Z. Popovic, 'Micro-Fabricated 130-180 GHz frequency scanning waveguide arrays, IEEE Trans. Antennas Propag., Aug. 2012, vol. 60, No. 8, pp. 3647-3653.

European Examination Report of EP App. No. 07150463.3 dated Feb. 16, 2015.

European Search Report of corresponding European Patent Application No. 08 15 3144 dated Jul. 2, 2008.

Extended EP Search Report for EP Application No. 12811132.5 dated Feb. 5, 2016.

H. Kazemi, "350mW G-band Medium Power Amplifier Fabricated Through a New Method of 3D-Copper Additive Manufacturing," IEEE 2015.

H. Kazemi, "Ultra-compact G-band 16way Power Splitter/Combiner Module Fabricated Through a New Method of 3D-Copper Additive Manufacturing," IEEE 2015.

H. Zhou, N. A. Sutton, D. S. Filipovic, "Surface micromachined millimeter-wave log-periodic dipole array antennas," IEEE Trans. Antennas Propag., Oct. 2012, vol. 60, No. 10, pp. 4573-4581.

H. Zhou, N. A. Sutton, D. S. Filipovic, "Wideband W-band patch antenna," 5th European Conference on Antennas and Propagation , Rome, Italy, Apr. 2011, pp. 1518-1521.

H. Zhou, N. A. Sutton, D. S. Filipovic, "W-band endfire log periodic dipole array," Proc. IEEE-APS/URSI Symposium, Spokane, WA, Jul. 2011, pp. 1233-1236.

Horton, M.C., et al., "The Digital Elliptic Filter—A Compact Sharp-Cutoff Design for Wide Bandstop or Bandpass Requirements," IEEE Transactions on Microwave Theory and Techniques, (1967) MIT-15:307-314.

International Search Report and Written Opinion for PCT/US2015/063192 dated May 20, 2016.

International Search Report corresponding to PCT/US12/46734 dated Nov. 20, 2012.

J. M. Oliver, J.-M. Rollin, K. Vanhille, S. Raman, "A W-band micromachined 3-D cavity-backed patch antenna array with integrated diode detector," IEEE Trans. Microwave Theory Tech., Feb. 2012, vol. 60, No. 2, pp. 284-292.

J. M. Oliver, P. E. Ralston, E. Cullens, L. M. Ranzani, S. Raman, K. Vanhille, "A W-band Micro-coaxial Passive Monopulse Comparator Network with Integrated Cavity—Backed Patch Antenna Array," 2011 IEEE MTT-S Int. Microwave, Symp., Baltimore, MD, Jun. 2011.

J. Mruk, "Wideband Monolithically Integrated Front-End Subsystems and Components," Thesis, 2011.

J. Mruk, Z. Hongyu, M. Uhm, Y. Saito, D. Filipovic, "Wideband mm-Wave Log-Periodic Antennas," 3rd European Conference on Antennas and Propagation, pp. 2284-2287, Mar. 2009.

J. Oliver, "3D Micromachined Passive Components and Active Circuit Integration for Millimeter-Wave Radar Applications," Thesis, Feb. 10, 2011.

T.E. Durham, "An 8-40GHz Wideband Instrument for Snow Measurements," Earth Science Technology Forum, Pasadena, CA, Jun. 2011.

Written Opinion corresponding to PCT/US12/46734 dated Nov. 20, 2012.

Y. Saito, D. Fontaine, J.-M. Rollin, D.S. Filipovic, "Monolithic micro-coaxial power dividers," Electronic Letts., Apr. 2009, pp. 469-470.

Y. Saito, J.R. Mruk, J.-M. Rollin, D.S. Filipovic, "X- through Q-band log-periodic antenna with monolithically integrated μ-coaxial impedance transformer/feeder," Electronic Letts. Jul. 2009, pp. 775-776.

Y. Saito, M.V. Lukic, D. Fontaine, J.-M. Rollin, D.S. Filipovic, "Monolithically Integrated Corporate-Fed Cavity-Backed Antennas," IEEE Trans. Antennas Propag., vol. 57, No. 9, Sep. 2009, pp. 2583-2590.

Z. Popovic, "Micro-coaxial micro-fabricated feeds for phased array antennas," in IEEE Int. Symp. on Phased Array Systems and Technology, Waltham, MA, Oct. 2010, pp. 1-10. (Invited).

Z. Popovic, K. Vanhille, N. Ehsan, E. Cullens, Y. Saito, J.-M. Rollin, C. Nichols, D. Sherrer, D. Fontaine, D. Filipovic, "Micro-fabricated

(56) References Cited

OTHER PUBLICATIONS micro-coaxial millimeter-wave components," in 2008 Int. Conf. on Infrared, Millimeter and Terahertz Waves, Pasadena, CA, Sep. 2008, pp. 1-3.

Z. Popovic, S. Rondineau, D. Filipovic, D. Sherrer, C. Nichols, J.-M. Rollin, and K. Vanhille, "An enabling new 3D architecture for microwave components and systems," Microwave Journal, Feb. 2008, pp. 66-86.

International Search Report and Written Opinion for PCT/US2015/011789 dated Apr. 10, 2015.

Derwent Abstract Translation of WO-2010-011911 A2 (published 2010).

* cited by examiner

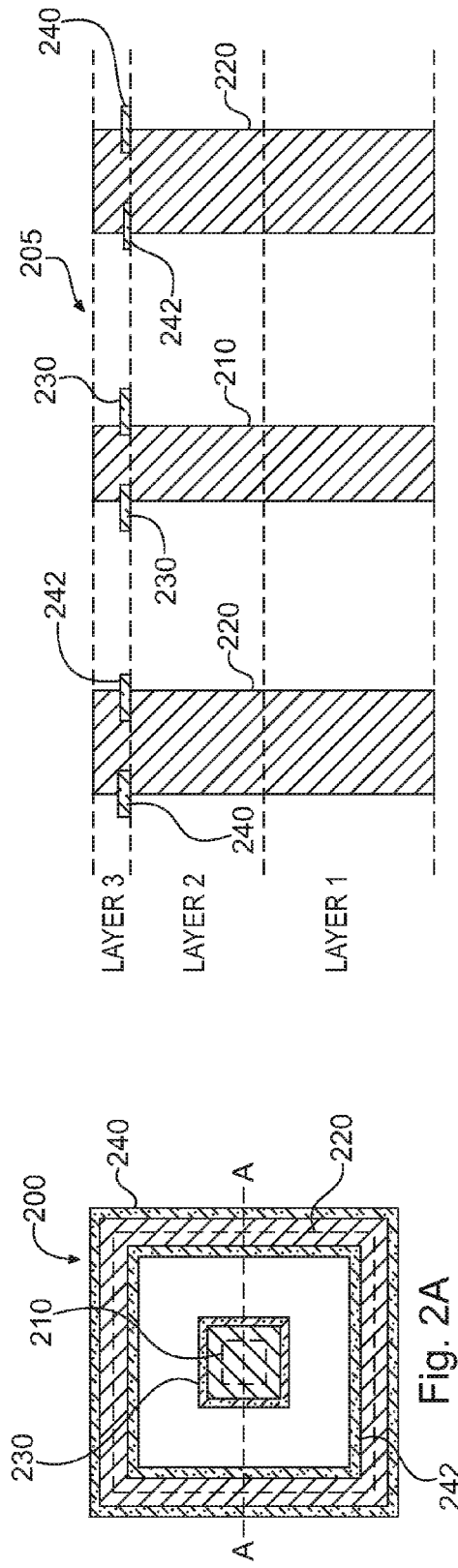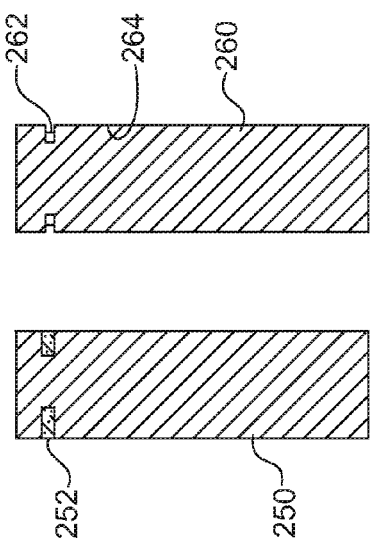

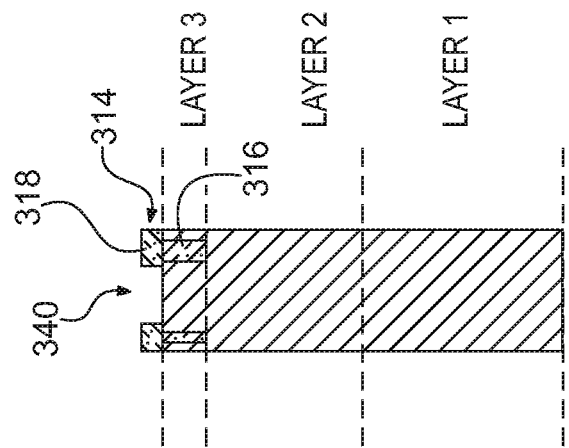
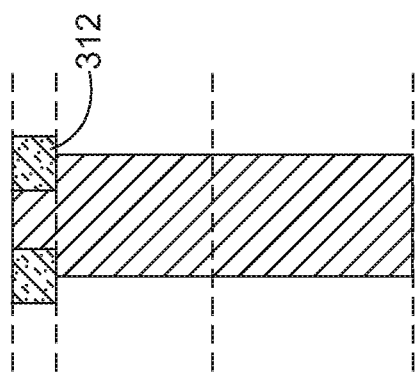
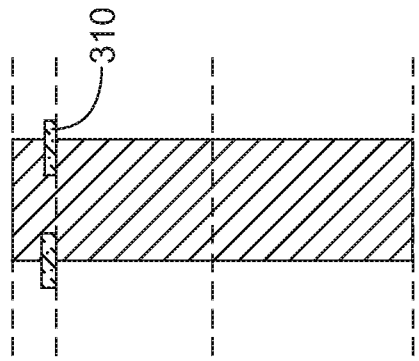

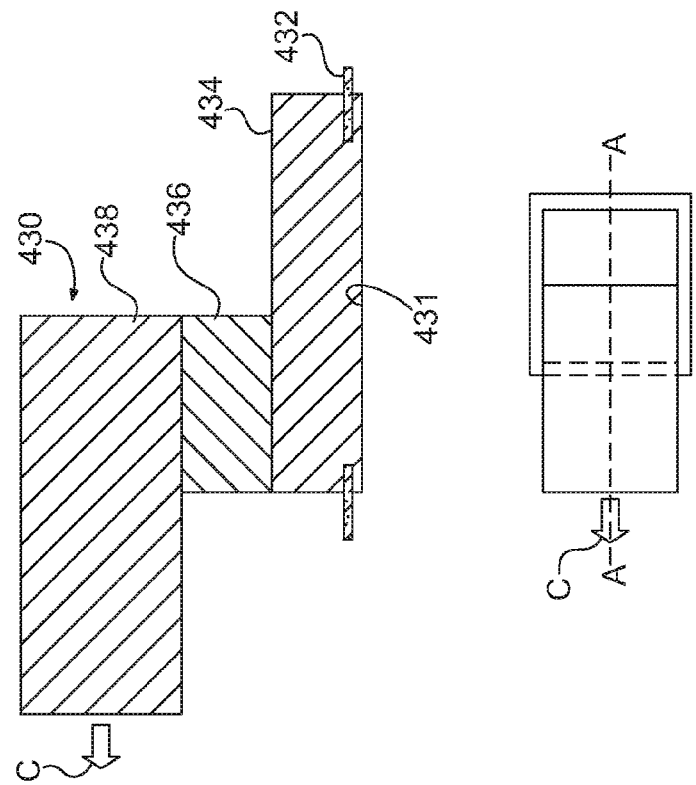
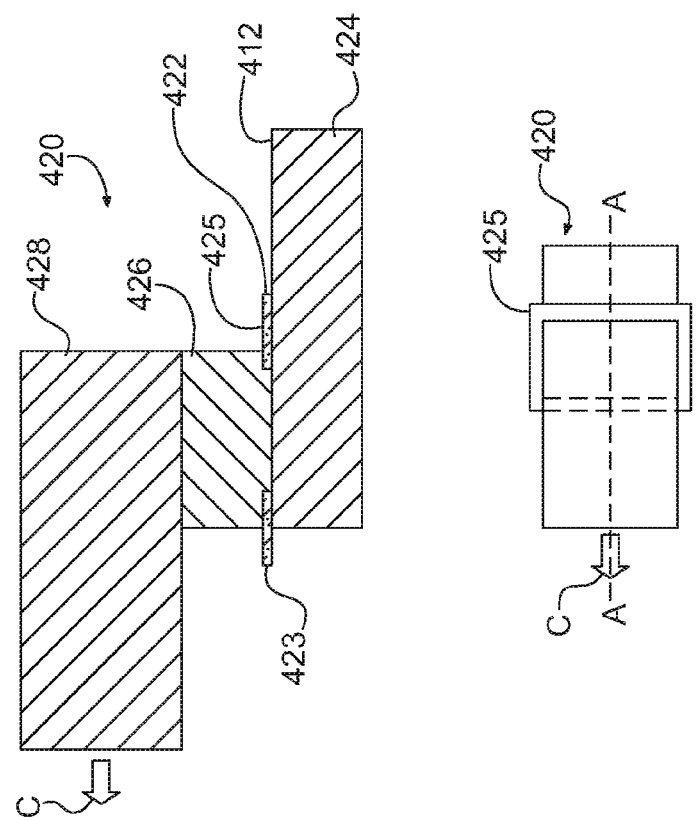

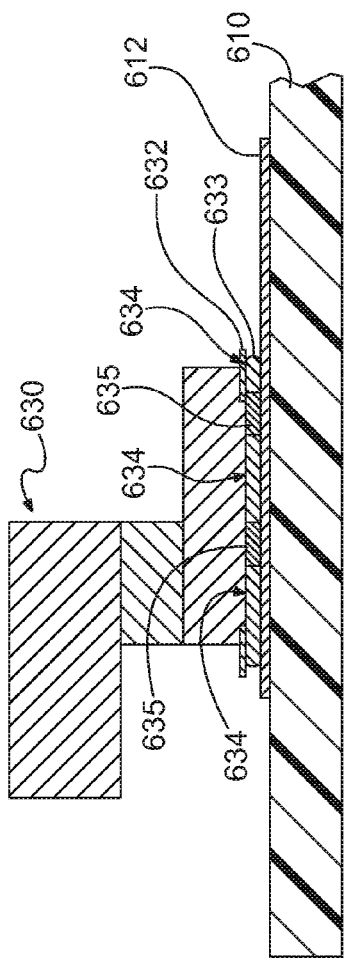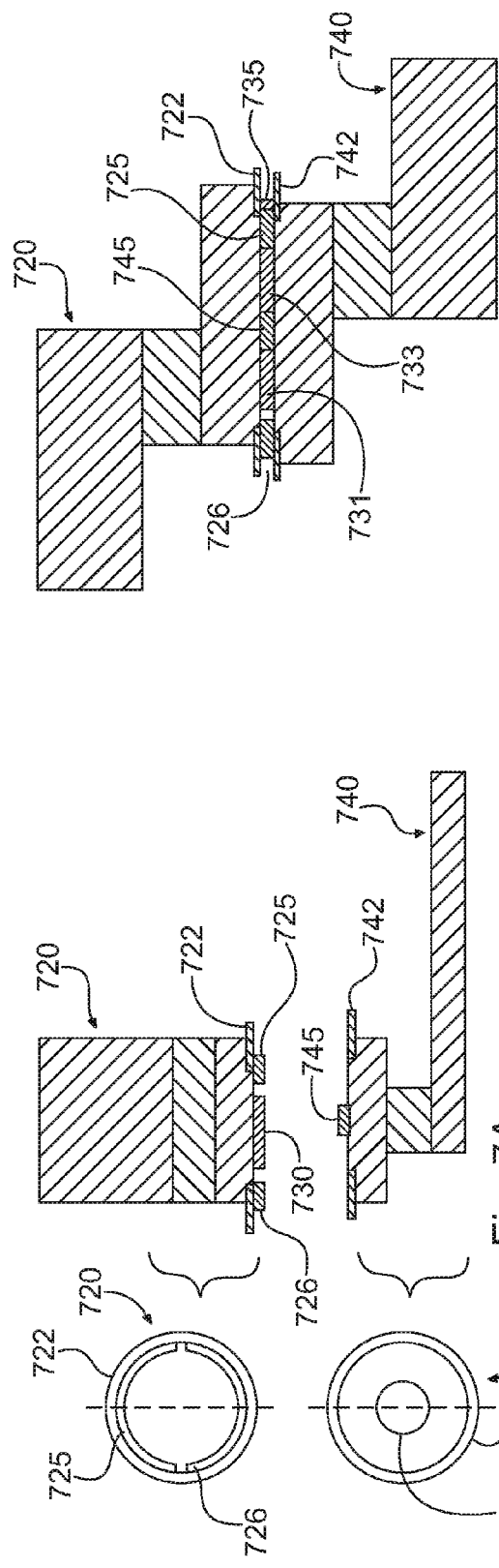

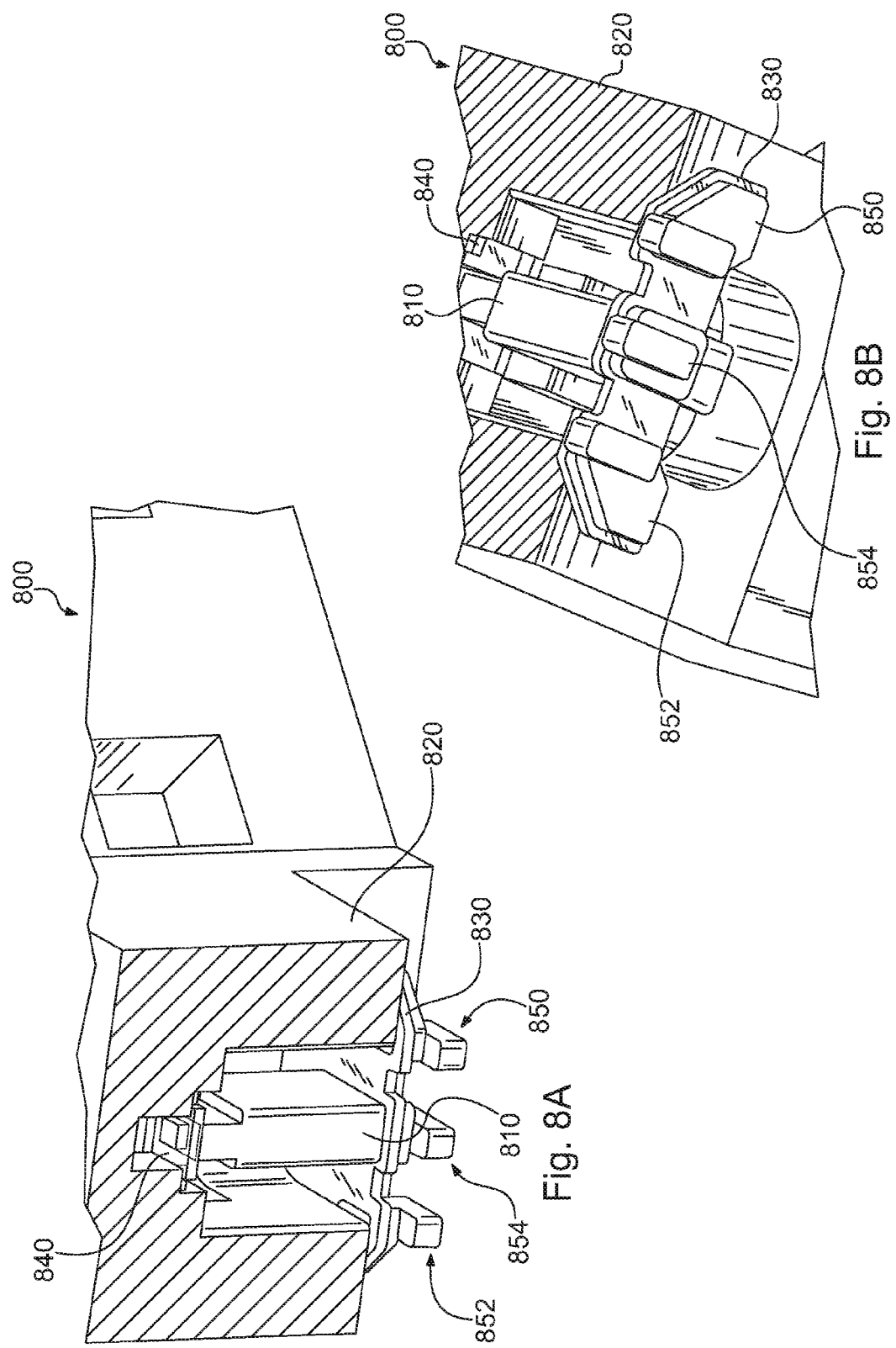

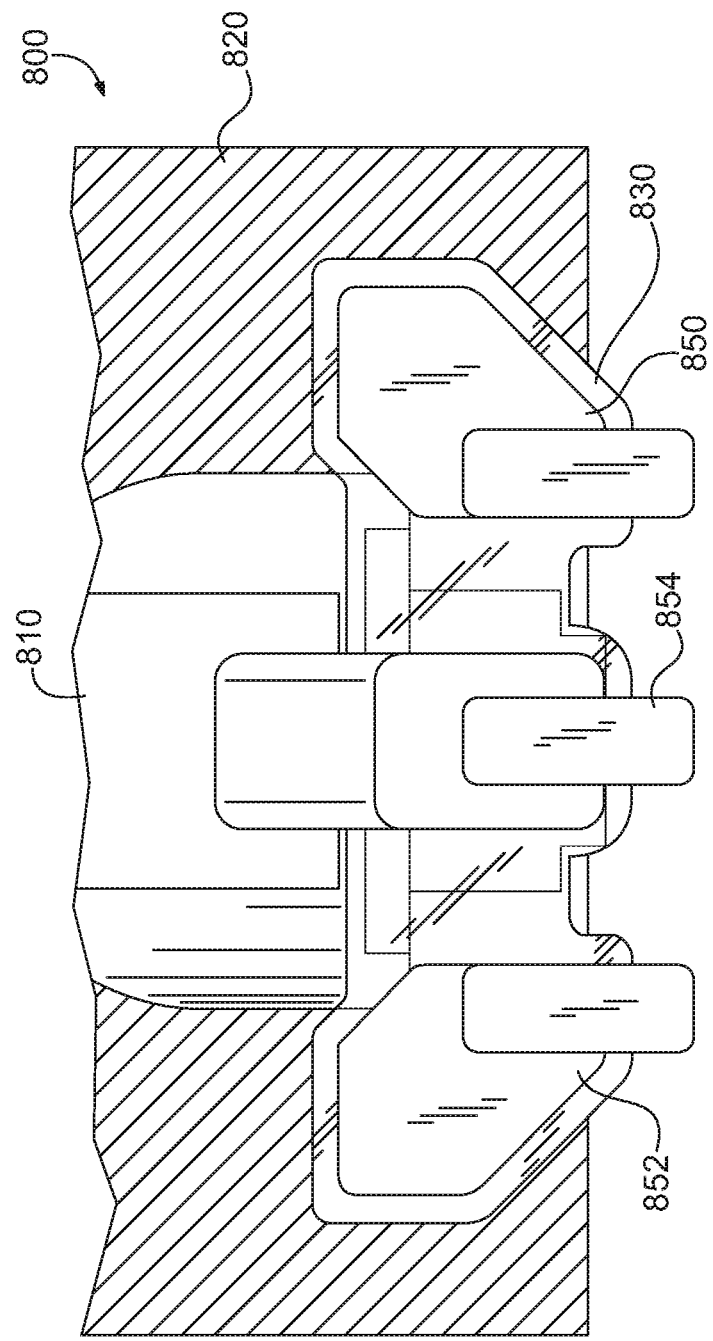

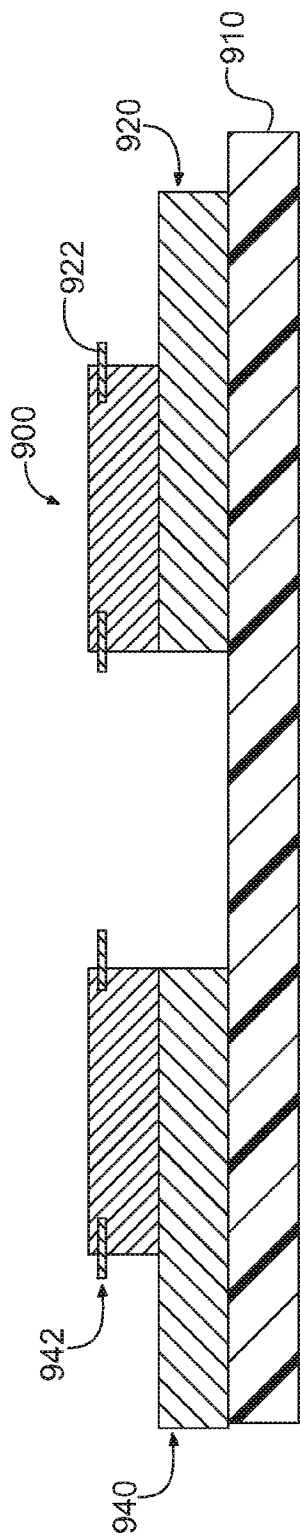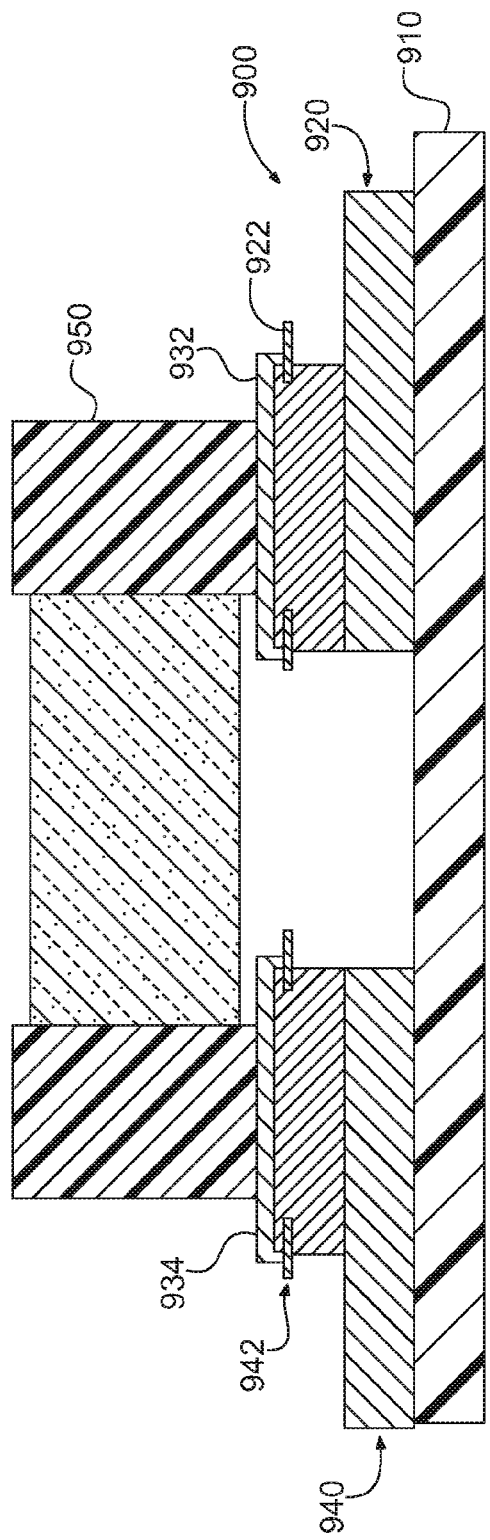

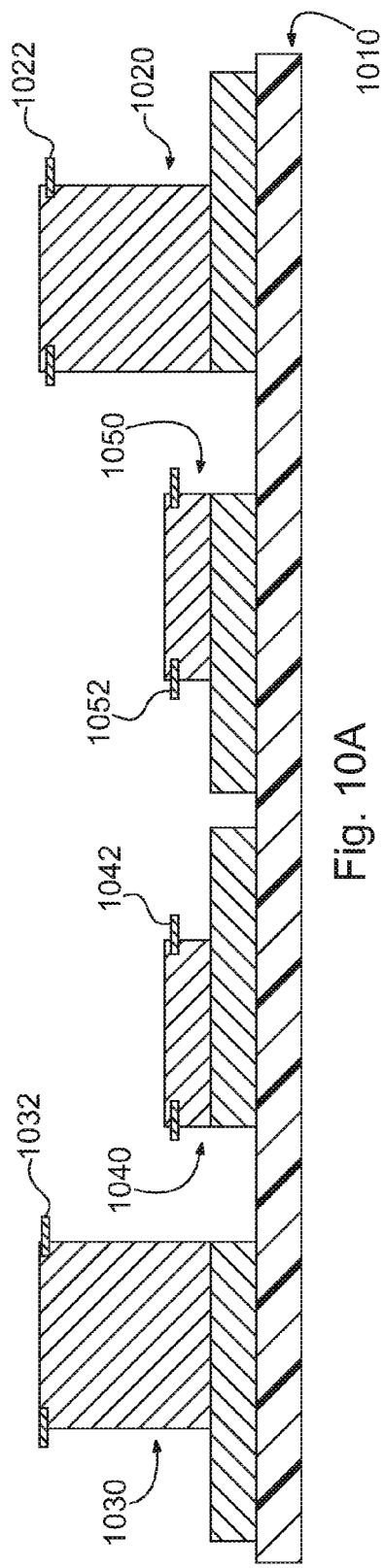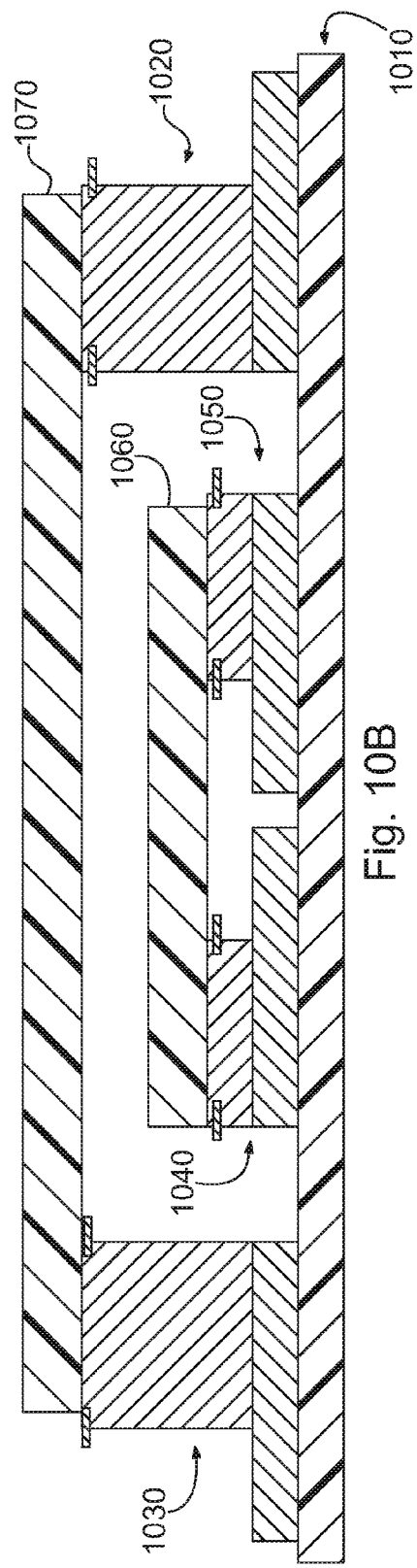
Fig. 10A
Fig. 10B

DEVICES AND METHODS FOR SOLDER FLOW CONTROL IN THREE-DIMENSIONAL MICROSTRUCTURES

RELATED APPLICATIONS

This application is a continuation of U.S. patent application Ser. No. 14/494,716, filed Sep. 24, 2014, which is a divisional of U.S. patent application Ser. No. 13/488,991, filed Jun. 5, 2012, now U.S. Pat. No. 8,866,300, which claims the benefit of priority of U.S. Provisional Application No. 61/493,516, filed on Jun. 5, 2011, the entire contents of which applications are incorporated herein by reference.

FIELD OF THE INVENTION

The present invention relates generally to control of the flow of a conductive material in electric, electronic and/or electromagnetic devices, such as three-dimensional microstructures (e.g., waveguide structures), and more particularly, but not exclusively, to structures, materials, and methods to control the spread of a solder material or other flowable conductive material, such as a conductive epoxy.

BACKGROUND OF THE INVENTION

With increasing demands on computational power and data transmission bandwidth, electronic devices and microstructures incorporating such devices are becoming increasingly complex necessitating a greater degree of mechanical and electrical interconnection among components. In response, three-dimensional microstructures provide a variety of advantages in accommodating the need for increased device performance. By way of example, three-dimensional microstructures and methods for their manufacture are illustrated at least at U.S. Pat. Nos. 7,948,335, 7,405,638, 7,148,772, 7,012,489, 7,649,432, 7,656,256, 7,755,174, 7,898,356, 8,031,037 and/or U.S. Application Pub. Nos. 2010/0109819, 2011/0210807, 2010/0296252, 2011/0273241, 2011/0123783, 2011/0181376 and/or 2011/0181377, each of which is hereby incorporated by reference in their entirety.

A typical approach for electrically and/or mechanically interconnecting both planar and three-dimensional microstructures is soldering. However, it may be difficult to stop solder from wicking up the length of a metal component, especially in view of the complex surface morphologies which may be encountered in three-dimensional microstructures, and particularly when such structures are made of or coated with metals such as gold, silver, copper or similar metals which are capable of promoting solder flow. For instance, the presence of a multitude of discrete components, mounting surfaces, interconnected chips, and so on presents a variety of surface height changes and void spaces prone to wicking molten solder along the surfaces of such components.

While the phenomena of adhesion of a desired solder to base metal may be called "wetting" and lack of it as "non-wetting", for the purposes of the present application the term "wicking" is defined to connote the flow (intended or unintended) of solder along the surface of parts, even though the physics of the flow is not one of traditional fluidic "wicking" in the sense as it occurs when a fabric contacts water. Wicking therefore in the context of the present application is the wetting of the solder, and to stop the wicking in the present application refers to stopping of wetting and flow of the solder past the intended boundaries. A clean thin layer of gold on platinum, intended for solder reflow, may for example, continue to wet the surface particularly in non-oxidizing conditions for a great distance until the solder thickness or composition due to interdiffusion becomes unacceptable for its intended purpose.

The unintended flow of solder throughout such microstructures may cause decreased performance, uncontrolled bond lines, shorting, solder embrittlement, and other problems. In traditional planar structures such as circuit boards control of the solder flow can be performed with a patterned solder mask. Often such materials are either selectively applied or patterned, e.g., photo-patterned, or they may be micro-sprayed. Whereas a "solder mask", such as a patterned planar dielectric coating, may be used to stop and/or control solder flow, in an open three-dimensional structure applying such a material may be relatively difficult to achieve for multiple reasons. First, the interconnects and/or electrical junctions where devices are to be attached may be on a layer other than the surface layer, precluding the use of dry film. Second, a complex three-dimensional structure may be hard to coat and/or pattern lithographically on more than one layer. Third, it may be desirable to ensure substantially complete removal of any existing solder mask materials as they may degrade performance such as RF performance, because they may not be applied with sufficient accuracy and/or quantity for many applications (e.g., microwave devices) onto such three-dimensional structures. These problems are aggravated when the desired pad dimensions for a solder or conductive adhesive continue to shrink from squares of hundreds of microns on a side to squares of tens of microns, as currently is the case for some microwave and mm-wave devices and circuits such as MMICs.

In addition, three-dimensional microstructures may include coatings of excellent conductors and/or noble metals, such as gold, which may aggravate a problem of solder flowing along a conductor in an uncontrolled manner. Further, solder thickness and even conductive adhesive thickness, as well as volume, in a particular location often need to be controlled as the these parameters can determine mechanical properties such as strength and resistance to fatigue. Maintaining the solder's reflow over a controlled location during attach can provide compositional control of the metals in the solder system as noble metals, diffusion barriers, and base metals tend to dissolve to varying degrees and therefore impact lifetime and other properties of the electro-mechanical junctions at the points of attach. Still, solder attach may be an important technique for high strength and reliable device attachment. Previous approaches for three-dimensional microstructures have failed to disclose how to maintain adhesion of such coatings particularly when the CTE match of the wettable metals and the non-wettable layers or "wick stop" materials may be highly mismatched. Thus, there remains a need to control flow, wetting area, and/or spread of solder material for three-dimensional micro-electric structures including, for example, those incorporated herein by reference above.

SUMMARY OF THE INVENTION

In one of its aspects, the present invention provides exemplary devices and methods in which mechanical interlocking the of the layers by overlapping their boundaries in three-dimensional cross-section provides mechanical and positional stability despite the large change in temperature associated with reflowing a material such a solder would induce, which can be on the order of 200° C. or more. In this regard, the present invention provides devices and methods in which reliance on chemical adhesion alone to keep the materials intact is not required.

For example, the present invention may provide an electronic microstructure having a mounting surface having at least a portion thereof configured to bond to one or more of a metallic solder and a conductive epoxy. A wick stop structure may be disposed away from the mounting surface at a location on the microstructure proximate the mounting surface, and may be configured to deter the flow of one or more of the metallic solder and the conductive epoxy from the mounting surface to a location on the microstructure beyond the location of the wick stop structure. In this regard, the wick stop structure may comprise a material which is non-wetting to metallic solder and may include a dielectric or a non-wetting metal, such as nickel. The wick stop structure may include a shelf which extends outwardly away from a surface of the microstructure at which the shelf is located and/or may have a portion disposed within the microstructure. Additionally or alternatively, the shelf may circumscribe a portion or all of the microstructure.

In a further aspect, the present invention may provide a method of forming an electronic microstructure comprising depositing a plurality of layers over a substrate, where the layers comprise one or more of a metal material, a sacrificial photoresist material, and a dielectric material, thereby forming an electronic microstructure above the substrate. The microstructure may include a mounting surface having at least a portion thereof configured to bond to one or more of a metallic solder and a conductive epoxy, and a wick stop structure disposed away from the mounting surface at a location on the microstructure proximate the mounting surface. The wick stop structure may be configured to deter the flow of one or more of the metallic solder and the conductive epoxy from the mounting surface to a location on the microstructure beyond the location of the wick stop structure. The microstructure may be remove from the substrate to provide a freestanding part.

BRIEF DESCRIPTION OF THE DRAWINGS

The foregoing summary and the following detailed description of the exemplary embodiments of the present invention may be further understood when read in conjunction with the appended drawings, in which:

FIGS. 2A-2C schematically illustrate a top view and side cross-sectional views, respectively, of exemplary wick stop structures in accordance with the present invention;

FIGS. 3A-3C schematically illustrate side cross-sectional views of further exemplary wick stop structures in accordance with the present invention;

FIGS. 4A and 4B schematically illustrate top views and side cross-sectional views of exemplary three-dimensional microstructures incorporating wick stop structures in accordance with the present invention;

FIG. 6 schematically illustrates a side cross-sectional view of a further exemplary three-dimensional microstructure incorporating wick stop structures and solder gap-setting structures in accordance with the present invention;

FIGS. 7A and 7B schematically illustrate exemplary three-dimensional microstructure junctions incorporating wick stop structures and solder gap-setting structures in accordance with the present invention;

FIGS. 8A and 8B schematically illustrate isometric views in partial cross-section of a coax to ground-signal-ground (G-S-G) microstructure in accordance with the present invention;

FIG. 8E schematically illustrates a bottom view of the coax to G-S-G microstructure of FIGS. 8A and 8B;

FIGS. 9A and 9B schematically illustrate side cross-sectional views of a SMT 2-ended device such as a resistor, pre- and post-soldering, respectively, along with exemplary microstructures comprising wick stops in accordance with the present invention; and FIGS. 10A and 10B schematically illustrate side cross-sectional views, pre- and post-soldering, respectively, of exemplary multi-layer flip chip mounting microstructures comprising wick stops in accordance with an aspect of the present invention.

DETAILED DESCRIPTION OF THE INVENTION

Figure 1A:
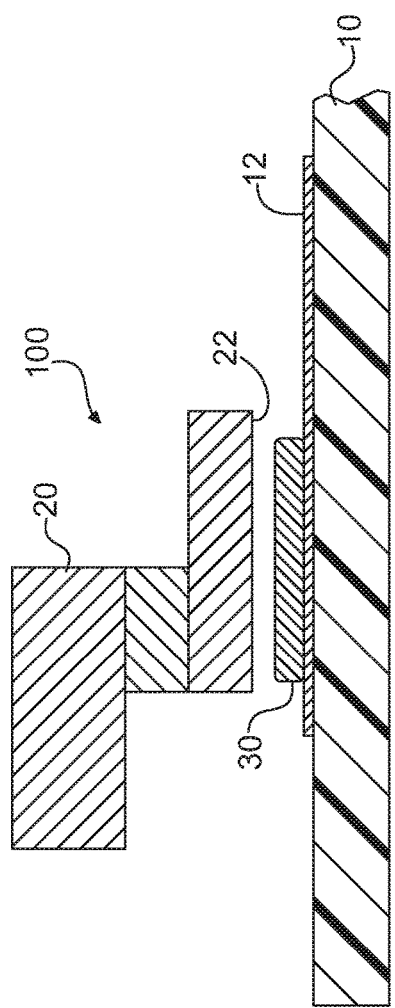
FIGS. 1A and 1B schematically illustrate in side cross-section a portion of a microstructure and a substrate or second structure, pre- and post-soldering, respectively, demonstrating problematic solder flow to unintended microstructure locations.
Figure 1B:
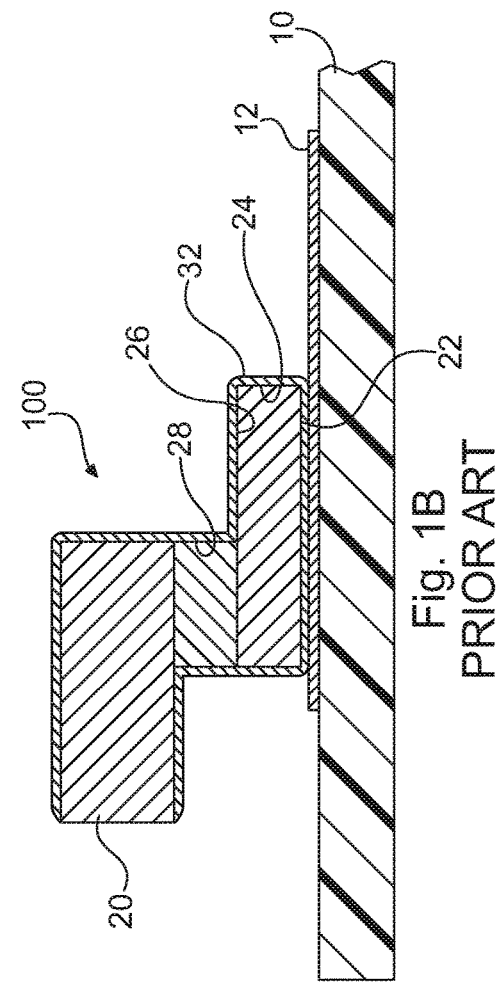

Referring now to the figures, wherein like elements are numbered alike throughout, an aspect of the present invention may be understood by reference to FIGS. 1A-1B in which one of the problems addressed by the present invention is illustrated. FIG. 1A schematically illustrates a device 100 prior to assembly comprising a portion of a three-dimensional microstructure 20 for electrical and/or mechanical connection to a base layer 10, such as a circuit board. The base layer 10 may include a metal component, such as a circuit board trace 12, to which the three-dimensional microstructure 20 is to be attached, and attachment may be effected through the use of a solder 30 disposed between a mounting surface 22 of the three-dimensional microstructure 20 and the circuit board trace 12. The microstructure may for example be comprised of copper with a thin surface coating of nickel and gold as is common for an electrical conductor in microelectronics. Upon heating, the solder 30 is melted and the three-dimensional microstructure 20 is either already in physical contact or brought into physical contact with the molten solder 32 to effect attachment of the three-dimensional microstructure 20 to the circuit board trace 12, FIG. 1B. However, due to the wetting properties of the molten solder 32 relative to the three-dimensional microstructure 20, the solder 32 may flow up or along the surface of the three-dimensional microstructure 20 substantially beyond the mounting surface 22 and coat additional surfaces 24, 26, 28 of the three-dimensional microstructure 20, which were not intended to be coated with the solder 32. The coating of these additional surfaces 24, 26, 28 with the metallic solder 32 has the potential to cause performance loss through reduced conductivity, shorting, uncontrolled bond line thickness, change in composition, etc. Accordingly, in one of its aspects the present invention prevents or deters the unwanted flow of solder onto surfaces and structures which are to remain free of solder.

For instance, in one of the aspects of the present invention, a non-wetting material may be used to control flow, wetting area, and/or spread of a material, such as a solder, thereby substantially minimizing, inhibiting and/or stopping unintentional solder flow. As used throughout the present disclosure, a non-wetting material may include an insulating material, which in turn may include a dielectric material, such as a photopatternable dielectric which may form a solder flow stop. The non-wetting material may also include a secondary metal, such as a plated nickel ring instead of and/or in addition to a dielectric non-wetting material, for example. Nickel may form a non-wetting oxide and/or may stop the solder flow, and may be employed when the required use temperature may exceed the temperature limits of a dielectric and/or may be used where metal to metal bonding in the microstructure is desired. In exemplary configurations of the present invention, the dielectric material may be replaced with a non-wetting metal, for example if such use would not cause shorting between conductors (e.g., circumscribing a metal, but not bridging two conductors as can be done with a dielectric). The non-wetting material may be permanent or non-permanent. For example, when solder wetting control is of concern, a dielectric material may include a selectively soluble material that is able to survive the release process of a sacrificial material used to make a multilayer structure, but which is then dissolved away after release and after the passivation coatings are applied (e.g., electroless nickel followed by electroless gold). When stop material is dissolved at this point, a base metal may be exposed. By applying electroless nickel again, an exposed base metal (e.g., copper) may be made to plate selectively to gold, producing a relatively thin passivated metal ring of non-wetting metal.

The non-wetting material may be grown mechanically into the lines in a multi-layer build, for example using a multi-layer three-dimensional build process and/or any other suitable process. The multilayer build process may desirably include an electrodeposition process, a transfer bonding process, a dispensing process, a lamination process, a solid three-dimensional printing process, a laser-fusion of particles process, a vapor deposition process, a screen printing process, a squeegee process, and/or a pick-and-place process. For example, a sequential build process may include one or more material integration processes employed to form a portion and/or substantially all of an apparatus. The sequential build process may be accomplished through processes including various combinations of: (a) metal material, sacrificial material (e.g., photoresist), insulative material (e.g., dielectric) and/or thermally conductive material deposition processes; (b) surface planarization; (c) photolithography; and/or (d) etching or other layer removal processes. Plating techniques may be useful, although other deposition techniques such as physical vapor deposition (PVD) and/or chemical vapor deposition (CVD) techniques may be employed.

The sequential build process may include disposing a plurality of layers over a substrate, which may include one or more layers of a dielectric material, one or more layers of a metal material and/or one or more layers of a resist material. In exemplary configurations, a first microstructural element, such as a support member and/or a solder flow stop member, may be formed of dielectric material. The support structure and/or a solder flow stop member may include an anchoring portion, such as an aperture extending at least partially there-through. One or more layers may be etched by any suitable process, for example wet and/or dry etching processes.

The sequential build process may also include depositing one or more layers of thermally conductive materials, which may be deposited at any desired location, for example at substantially the same in-plane location as a layer of the first microstructural element and/or second microstructural element. In addition, one or more layers of thermally conductive material may be deposited at any desired location, for example spaced apart from one or more layers of the first microstructural element and/or second microstructural element.

In conjunction with the present invention any material integration process may be employed to form a part and/or all of an apparatus. For example, one or more of a transfer bonding, lamination, pick-and-place, deposition transfer (e.g., slurry transfer), and electroplating on or over a substrate layer (which may be mid-build of a process flow) may be employed. A transfer bonding process may include affixing a first material to a carrier substrate, patterning a material, affixing a patterned material to a substrate, and/or releasing a carrier substrate. A lamination process may include patterning a material before and/or after a material is laminated to a substrate layer and/or any other desired layer. A material may be supported by a support lattice to suspend it before it is laminated, and then it may be laminated to a layer or the material may be selectively dispensed. The material may include a layer of a material and/or a portion of an apparatus, for example pick-and-placing one or more waveguide structures on and/or over a conductive surface.

In certain instances, adhesion between a dielectric and metal may not be required, for example where elements may be mechanically constrained. In such a case, the dielectric material may remain a permanent part of a structure. For example, a non-wetting material, such as a dielectric solder flow stop member, may circumscribe a metal element, as a sheet and/or a perforated sheet. For cases where a sheet is included, the sheet may form the base of a BGA(ball grid array)-like package, which may enable QFN(quad-flat no-lead)-like and/or similar structures including maximized RF performance, higher complexity, small pitch, etc.

In a further example of the structures to which the present invention may be applied, a metal material may be deposited in an aperture of a first microstructural element, affixing the first microstructural element to a second microstructural element. For example when an anchoring portion includes a re-entrant profile, a first microstructural element may be affixed to a second microstructural element by forming a layer of a second microstructural element on a layer of a first microstructural element. Sacrificial material may be removed to form a non-solid volume, which may be occupied by a gas such as air or sulfur hexafluoride, a void, or a liquid, and/or to which a first microstructural element, second microstructural element and/or thermal member may be exposed. The non-solid volume may be filled with dielectric material, and an insulative material may be disposed between any one of a first microstructural element, a second microstructural element and/or a thermal manager.

As an illustrative use of the aforementioned materials, structures, and methods of the present invention, a coaxial microstructure 200 is illustrated in FIGS. 2A, 2B. The coaxial microstructure 200 may include non-wetting wick stop shelves 230, 240, 242 to circumscribe device components, such as center and outer conductors 210, 220, to inhibit, minimize, and/or stop the wetting flow of solder beyond the region intended to be coated with solder, such as an end portion 205 of the coaxial microstructure 200, thereby addressing problems associated with the uncontrolled flow of solder. Since the outer conductor 220 may typically comprise a hollow structure surrounding the center conductor 210, the outer conductor 220 may be provided with both an interior wick stop shelf 242 and an exterior wick stop shelf 240 to deter or prevent the flow of solder on either side of the outer conductor 220.

The wick stop shelves 240, 242, 310 may be relatively thin, e.g., a fraction of the thickness of the strata (i.e., layer thickness) in which the wick stop shelves 240, 242, 310 are built, FIG. 2B, 3A. Alternatively or additionally, the wick stop shelf 312 may be the full thickness of the layer depending on, for example, device requirements and operation, FIG. 3B. For example Layer 3 of FIG. 2B may be 5 to 500 microns in thickness and may be formed from one layer containing materials of different heights of thicknesses or may be comprised of two sublayers, one formed to the height or thickness of wick stop shelf 240 and a second continuing past that height or thickness to complete the full thickness of Layer 3. Alternatively or additionally, the wick stop 252, 262 comprising a non-wetting material, may be disposed internally to a part 250, 260 so the wick stop 252, 262 is flush with, or recessed within, a surface 264 of the part 250, 260, FIG. 2C. In such configurations, the non-wetting nature of the wick stop 252, 262 may deter or stop the flow of solder without the need for a mechanical shelf which protrudes externally from the part 250 in which the wick stop 252, 262 is incorporated. The ability to stop the flow of solder without the use of a shelf configuration may be desirable in cases where potential breakage of a shelf is a concern, or where mechanical interference by the shelf or the dielectric material should be minimized. In the cases shown in FIGS. 2B and 2C, the wick-stop 252, 262 may be mechanically entrenched or interlocked into the central electrically conductive structure 250, 260 so that chemical adhesion alone is not required over the solder reflow temperature range.

The non-wetting wick stop shelves 230, 240, 242 may be formed as part of a multi-layer build process and/or any other suitable process. By way of example, the coaxial microstructure 200 may be fabricated by sequentially building Layers 1 and 2, after which the wick stop shelves 230, 240, 242 may be fabricated during the portion of the sequential build process which provides Layer 3. In particular, Layer 1 and Layer 2 may be formed by sequential build of sacrificial material and a plated and/or grown material, such as photoresist and copper electroplating. A photoresist mold, e.g., sacrificial material, is illustrated substantially removed in FIG. 2B. In addition, seed layers may be optionally applied after each layer, as needed. In Layer 3, for example, a seed layer may be applied to Layer 2. A dielectric may be applied and/or patterned, and this may be followed by another seed layer as needed. A sacrificial resist may be applied and/or planarized over a permanent dielectric. The resist may be patterned and then a conductive material, e.g., metal, in Layer 3 may be grown by electrodeposition, for example. Layer 3 may be planarized via CMP, for example, and more layers may be added as desired or needed. In one exemplary configuration, a permanent dielectric (or non-conductor or a material not wettable by the solder) 314 may be formed in multiple layers, such as two layers 316, 318, FIG. 3C. The first layer 316 may provide a mechanical anchor, and the second layer 314, formed after Layer 3, may provide a masking region and may also set a thickness for a solder or conductive adhesive applied to the interior region 340 of layer 318. The anchor 316 may substantially minimize adhesion failure of the second layer 314 in processing and/or use. However, if sufficient chemical adhesion can be obtained, the anchor 316 may be eliminated. Additionally or alternatively to a multi-layer build process, a non-wetting wick stop may be provided as a coating by atomic layer deposition, or other suitable processes, for example, over a conductive structure 250, 260. The coating may be patterned, such as by selective etching or other suitable technique, to provide non-wetting wick stop layer(s) on desired potions of the conductive structure 250, 260, such as at the locations illustrated in FIG. 2C, for example.

In view of the teaching of FIGS. 2A-2C, 3A-3C and the exemplary wick stop shelves/layers illustrated therein, solution to the problem illustrated in FIGS. 1A, 1B in accordance with one aspect of the present invention is illustrated in FIGS. 4A, 4B, in which respective three-dimensional microstructures 420, 430 are provided with wick stops 425, 432. Specifically FIG. 4A schematically illustrates a top down view and side cross-sectional view of the three-dimensional microstructure 420 which may be fabricated via a multilayer build process to comprise layers 424, 426, 428. (The arrow labeled "C" conceptually illustrates that additional portions of the three-dimensional microstructure 420 may extend from the portion of the microstructure 420 illustrated.) Proximate an upper surface 412 of layer 424 a wick stop 425 may be provided at a location which circumscribes layer 426. The wick stop layer 422 may comprise any of the exemplary materials discussed above and may be formed by any of the fabrication techniques discussed above in connection with FIGS. 2A-2C, 3A-3C. In particular, the wick stop 425 may include a wick stop shelf 423 extending beyond the perimeter of layer 424 to mechanically block the flow of solder upward from layer 424 onto layer 426. In addition, the wick stop 425 may include a wick stop layer 422 overlying the upper surface 412 of the layer 424 in a configuration where the wick stop layer 422 prevents or deters the flow of solder due to the non-wetting nature of the material from which the wick stop layer 422 is composed.

Figure 5A:
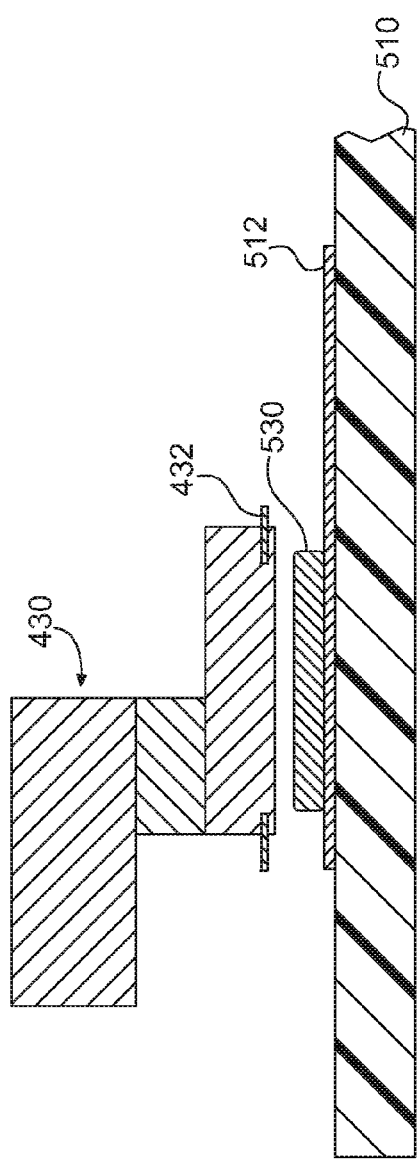
FIGS. 5A and 5B schematically illustrate the microstructure of FIG. 4B, pre- and post-soldering, respectively, demonstrating containment of solder flow in accordance with an aspect of the present invention.

In a further exemplary configuration in accordance with the present invention, FIG. 4B schematically illustrates a top down view and side cross-sectional view of a three-dimensional microstructure 430 which may be fabricated in a manner similar to that of microstructure 420 and which includes layers 434, 436, 438. (The arrow labeled "C" again conceptually illustrates that additional portions of the microstructure 430 may extend beyond that which is shown in FIG. 4B.) A wick stop shelf 432 may be provided near a lower surface 431 of layer 434, which may comprise any of the exemplary materials discussed above and may be formed by any of the fabrication techniques discussed above in connection with FIGS. 2A-2C, 3A-3C. The ability of the wick stop shelf 432 to deter or prevent the flow of solder is further illustrated in FIG. 5A which shows the three-dimensional microstructure 430 in position prior to assembly above base layer 510 to which the three-dimensional microstructure 430 is to be attached. The base layer 510 may include a circuit board, hybrid circuit, semiconductor device, a further three-dimensional structure, and/or any other suitable structure, and may include a metallic component 512 disposed thereon. Solder or solder paste 530 may be disposed intermediate the three-dimensional microstructure 430 and the metallic component 512. Upon melting, the solder 532 flows to mechanically and/or electrically connect the three-dimensional microstructure 430 to the metallic component 512 of the base layer 510. However, in contrast to the situation illustrated in FIG. 1B, the wick stop shelf 432 deters or prevents the flow of solder 532 upward past the wick stop shelf 432 along the surfaces of the three-dimensional microstructure 430, FIG. 5B.

In yet a further aspect of the present invention, a three-dimensional microstructure 630 may be provided with stop pads 635 which may function to establish the thickness of a bonding material, such as a conductive epoxy (or solder)

Figure 5B:
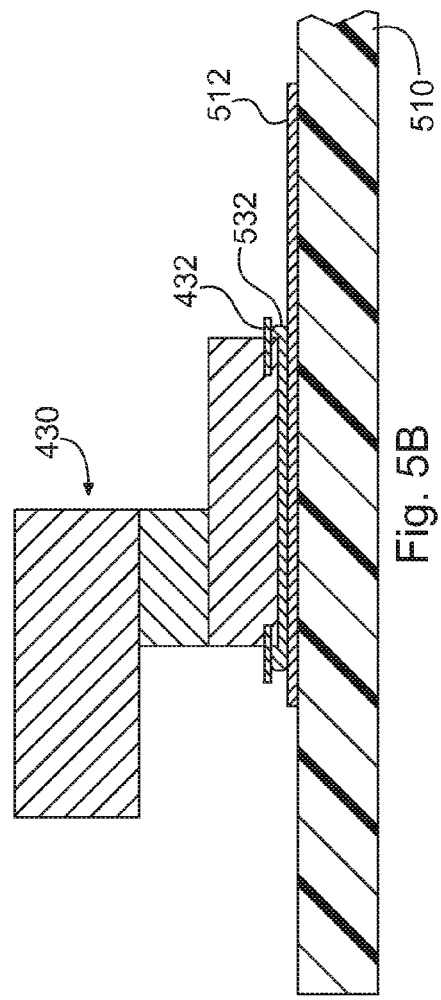

633, FIG. 6. The stop pads 635 may also provide for direct or nearly direct contact between the microstructure 630 and the device to which is it is bonded, layer 612 on 610. Similar to the structures depicted in FIG. 5B, FIG. 6 schematically illustrates attachment of the three-dimensional microstructure 630 to a metallic part 612 of a base layer 610, which may include a circuit board, hybrid circuit, semiconductor device, a further three-dimensional structure, and/or any other suitable structure. Unlike the three-dimensional microstructure 530 of FIG. 5B, the three-dimensional microstructure 630 includes stop pads 635 disposed on a lower surface of the microstructure 630 at a location intermediate microstructure 630 and the metallic part 612 of the base layer 610. The stop pads 635 have a lateral height (or thickness) and, when seated in contact with the metallic part 612, provide bondline gaps 634 between the three-dimensional microstructure 630 and the metallic part 612, which gaps 634 have the same height as the stop pads 635 independent of the downward force used to attach the three-dimensional microstructure 630 to the metallic part 612. In addition, the stop pads 635 may maximize or enhance wetting in the contact region between the three-dimensional microstructure 630 and the metallic part 612. The conductive epoxy (or solder) 633 may fill the bond gaps 634 to attach the three-dimensional microstructure 630 to the metallic part 612. A wick (or flow) stop shelf 632 is also provided to cooperate with the bond gaps 634 to maintain the desired thickness of the conductive epoxy 633 at the periphery of the three-dimensional microstructure 630, while at the same time preventing or deterring flow of the solder or conductive epoxy 633 onto portions of the three-dimensional microstructure 630 disposed above the wick stop shelf 632. It should be noted that the material of stop pads 635 could be the same as that of other larger microstructure layers, or the non-wettable portion of 630, i.e., wick stop shelf 632, depending other aspects of the intended function, for example depending on the needs for the electrical conductivity and/or its thermal conductivity, and so on. For example if the bulk of microstructure 630 is copper and being used for its high electrical and thermal conductivity, having mechanical stop pads 635 also composed of copper would typically provide improved thermal and electrical conductivity between the microstructure 630 and the substrate 610 as copper typically has better electrical and thermal conductivity than solders or conductive epoxies.

By way of further example, FIG. 7A illustrates similar principles of the present invention, but in the context of three-dimensional microstructure junctions (i.e., exemplifying the situation where the base layer 610 is a three-dimensional microstructure). Specifically, first and second three-dimensional microstructures 720, 740, respectively, may be provided, each of which includes respective stop pads 725, 726, 745 and a respective wick stop shelf 722, 742. The stop pads 725, 726, 745 may mechanically cooperate to set bond gaps between the mating surfaces of the first and second three-dimensional microstructures 720, 740 for receiving a solder (or conductive epoxy) 730. Post assembly, each bond may be filled with a respective portion of the solder 731, 733, 735, FIG. 7B. The optional gaps shown between the stop pads 725, 726 may be used to allow excess conductive epoxy, solder, or any other bonding medium, e.g., solder 730, to flow in a controlled manner between non-wetting layers, wick stop shelves 722, 742. While shelves 722, 742 are not shown mechanically constrained as are the shelves 310 in FIG. 3A, the shelves 722, 742 may readily be so-constructed.

In another of its aspects, the present invention may be utilized in configurations relating to coaxial to ground-signal-ground (G-S-G) launch, such as for DC—100+ GHz launches. With reference to FIGS. 8A-8E, an exemplary coaxial microstructure 800 is illustrated having an outer conductor 820 and a center conductor 810 making a downward Z-transition. The center conductor 810 may be supported within the outer conductor 820 by a dielectric support 840 which may minimize upward and lateral motion of the center conductor 810 within the outer conductor 820. To provide termination of the coaxial microstructure 800 in a manner that facilitates mounting of the coaxial microstructure 800 to another device, such as on an MMIC or circuit board, for example, grounding feet 850, 852 may be provided in electrical communication with the outer conductor, and signal foot 854 may be provided in electrical communication with the center conductor 810. A dielectric wick stop 830 may be provided between the feet 850, 852, 854 and the center and the outer conductors 810, 820 to deter or prevent the flow of solder upward from the feet 850, 852, 854 onto the center and outer conductors 810, 820. In addition, the dielectric wick stop 830 may also provide support to the center conductor 810 to provide mechanical stability of the center conductor 810 relative to the outer conductor 820. Alternatively, the wick stop 830 may be provided as individual wick stops on each of the feet 850, 852, 854 using any suitable wick stop configuration, such as those depicted in FIGS. 2A-2C, 3A-3C, for example.

Figure 8D:
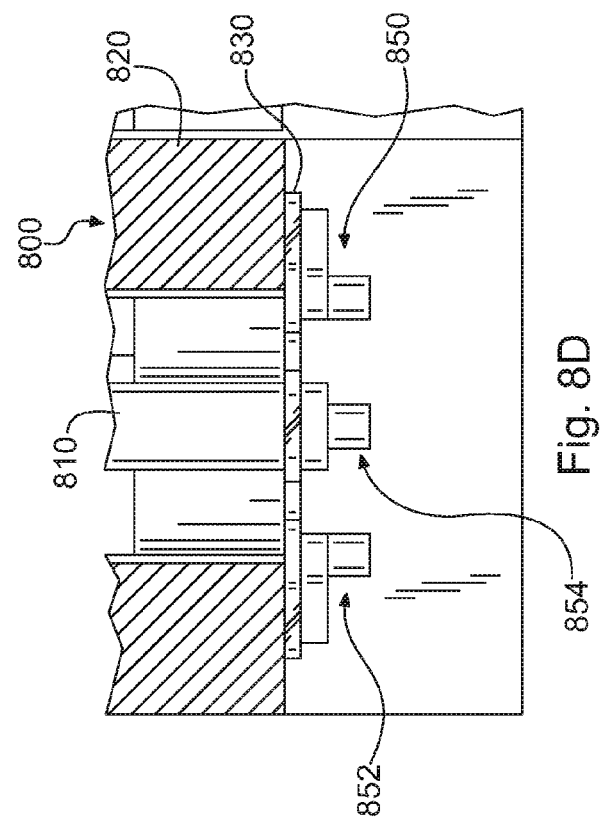
FIGS. 8C and 8D schematically illustrate a side view and front elevational view in partial cross-section, respectively, of the coax to G-S-G microstructure of FIGS. 8A and 8B.
Figure 8C:
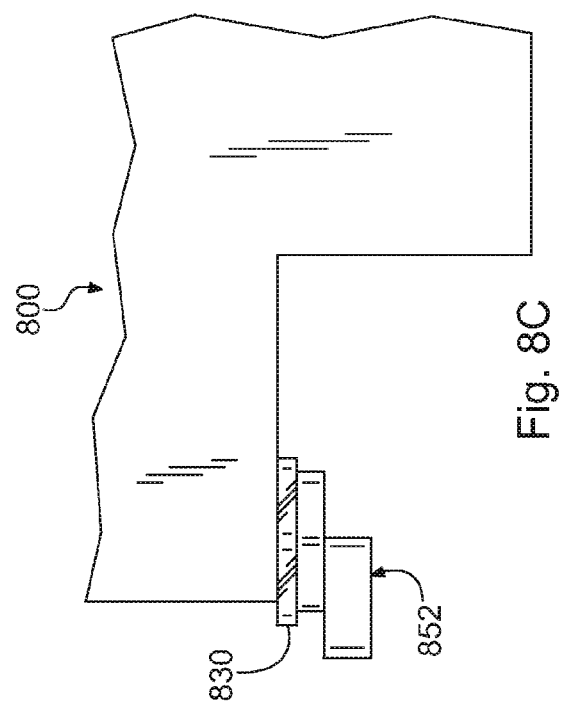

In certain configurations the coaxial microstructure 800 may serve as a jumper connecting two chips, and therefore the height of the terminal comprising the ground and signal feet 850, 852, 854 may be within the height of the outer conductor 820, FIG. 8C, 8D. Alternatively, if the coaxial microstructure 800 were intended to be used in a surface mount application, the ground and signal feet 850, 852, 854 could be provided at a location such that the feet 850, 852, 854 are flush with the surface of the coaxial microstructure 800 or protrude from the surface of the coaxial microstructure 800.

In yet a further of its aspects, the present invention may be utilized in attach of SMT (surface-mount technology) devices or flip chip mounting applications. For example, with reference to FIGS. 9A-9B, application of the present invention to SMT mounting is illustrated in which microstructures such as electrical conductors 920, 940 lead to mounting pads or mounting surfaces, shown on base layer 910, such as a circuit board, ceramic substrate, IC, or lower layers of microstructures. Dielectric or non-wetting wick stop shelves 922, 942 may be provided proximate a surface of the mounting pads 920, 940 where surface mounting is to be effected, FIG. 9A. Upon application and melting of a solder 932, 934 a surface mount component 950, such as a resistor or capacitor, may be electrically and mechanically connected to the mounting pads 920, 940, FIG. 9B. Such solders may alternatively be already disposed on the mounting pads 920, 940 or the surface mount component's electrical mounting terminals. In such a configuration, the wick stop shelves 922, 942 deter or prevent the flow of solder downward beyond the mounting region onto the mounting pads 920, 940, and potentially onto the base layer 910. In a similar manner, the present invention may provide advantages in flip chip mounting, including multi-layer applications which allow parts to be mounted over one another. For example, a base layer 1010, such as a circuit board or hybrid microelectronic circuit, may include mounting pads 1020, 1030, 1040, 1050 of varying heights disposed thereon, FIG. 10A. Each mounting pad 1020, 1030, 1040, 1050 may include a respective dielectric wick stop shelf 1022, 1032, 1042, 1052 proximate a mounting surface of their respective mounting pads 1020, 1030, 1040, 1050. Chips 1060, 1070 may be flip chip mounted to the mounting pads 1020, 1030, 1040, 1050 using a solder, the flow which solder downward towards the base layer 1010 may be deterred or prevented by the wick stop shelves 1022, 1032, 1042, 1052, FIG. 10B.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. An electronic microstructure, comprising:
   a plurality of layers of a metal and one or more layers of a material that is non-wetting to one or more of a metallic solder and a conductive epoxy;
   a mounting surface disposed at and including a selected one of the plurality of layers of metal;
   a wick stop structure formed of one or more of the plurality of layers of the non-wetting material, disposed away from the mounting surface and within the microstructure, the wick stop structure configured to deter a flow of one or more of the metallic solder and the conductive epoxy from the mounting surface to a location on the microstructure beyond the location of the wick stop structure.

2. The electronic microstructure of claim 1, wherein the material that is non-wetting comprises one or more of an insulating material, a dielectric, plated nickel, and a metal oxide.

3. The electronic microstructure of claim 1, comprising a stop pad at the mounting surface, the stop pad formed of one or more of the plurality of layers, for establishing the thickness of the metallic solder or conductive epoxy.

4. The electronic microstructure of claim 3, comprising a mechanical anchor disposed within the microstructure and attached to the stop pad, the anchor formed of one or more layers of the material that is non-wetting.

5. The electronic microstructure of claim 1, comprising one or more of a circuit board, hybrid circuit, and a semiconductor device operatively coupled to the mounting surface.

6. The electronic microstructure of claim 1, wherein the wick stop structure comprises a shelf which extends outwardly away from a surface of the microstructure at which the shelf is located.

7. The electronic microstructure according to claim 6, wherein the shelf circumscribes a portion of the microstructure.

8. The electronic microstructure according to claim 1, wherein the wick stop structure circumscribes a portion of the microstructure.

9. The electronic microstructure according to claim 1, wherein the wick stop structure is recessed within the microstructure.

10. The electronic microstructure according to claim 1, wherein the mounting surface comprises mounting feet to provide a G-S-G termination.

11. The electronic microstructure according to claim 10, wherein the mounting feet protrude from the mounting surface.

12. The electronic microstructure according to claim 1, wherein the microstructure comprises a coaxial microstructure.

13. The electronic microstructure according to claim 1, wherein the microstructure comprises a coaxial microstructure having a center conductor and wherein the wick stop structure supports the center conductor.

14. The electronic microstructure according to claim 1, comprising a chip flip-chip mounted to the mounting surface.

15. The electronic microstructure according to claim 1, comprising a surface mount component mounted to the mounting surface.

16. A method of forming the electronic microstructure of claim 1, comprising
   depositing the plurality of layers of metal and the one or more layers of a material that is non-wetting over a substrate, thereby forming the electronic microstructure of claim 1 above the substrate.

17. The method of claim 16, wherein the material that is non-wetting comprises one or more of an insulating material, a dielectric, plated nickel, and a metal oxide.

18. The method of claim 16, wherein the microstructure comprises a stop pad at the mounting surface, the stop pad formed of one or more of the plurality of layers, for establishing the thickness of the metallic solder or conductive epoxy.

19. The method of claim 18, wherein the microstructure comprises a mechanical anchor disposed within the microstructure and attached to the stop pad, the anchor formed of one or more layers of the material that is non-wetting.

20. The method of claim 16, comprising operatively coupling one or more of a circuit board, hybrid circuit, and a semiconductor device to the mounting surface.

21. The method of claim 16, wherein the wick stop structure comprises a shelf which extends outwardly away from a surface of the microstructure at which the shelf is located.

22. The method of claim 21, wherein the shelf comprises a portion disposed within the microstructure.

23. The method of claim 16, wherein the wick stop structure circumscribes a portion of the microstructure.

24. The method of claim 16, wherein the wick stop structure is recessed within the microstructure.

25. The method of claim 16, wherein the mounting surface comprises mounting feet to provide a G-S-G termination.

26. The method of claim 25, wherein the wick stop structure is disposed proximate the mounting feet that protrude from the mounting surface.

27. The method of claim 16, wherein the microstructure comprises a coaxial microstructure.

28. The method of claim 16, wherein the microstructure comprises a coaxial microstructure having a center conductor and wherein the wick stop structure supports the center conductor.

29. The method of claim 16, comprising flip-chip mounting a chip to the mounting surface.

30. The method of claim 16, comprising mounting a surface mount component to the mounting surface.

31. The method of claim 16, comprising providing the wick stop structure as a coating by atomic layer deposition.

* * * * *